United States Patent
Lim et al.

(10) Patent No.: US 9,248,471 B2
(45) Date of Patent: Feb. 2, 2016

(54) DEVICE AND METHOD FOR FORMING ROLL-TO-ROLL PATTERN

(71) Applicant: KOREA INSTITUTE OF SCIENCE AND TECHNOLOGY, Seoul (KR)

(72) Inventors: Jung Ah Lim, Gyeonggi-do (KR); Yong-Won Song, Daejeon (KR); Jae-Min Hong, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 262 days.

(21) Appl. No.: 13/850,558

(22) Filed: Mar. 26, 2013

(65) Prior Publication Data

US 2014/0037863 A1     Feb. 6, 2014

(30) Foreign Application Priority Data

Aug. 1, 2012   (KR) .................. 10-2012-0084553

(51) Int. Cl.
| | |
|---|---|
| *B05B 5/00* | (2006.01) |
| *B05C 11/00* | (2006.01) |
| *B05D 5/12* | (2006.01) |
| *H05K 3/12* | (2006.01) |

(52) U.S. Cl.
CPC ........ *B05D 5/12* (2013.01); *H05K 3/125* (2013.01); *H05K 2203/0165* (2013.01); *H05K 2203/082* (2013.01); *H05K 2203/1545* (2013.01)

(58) Field of Classification Search
USPC .......... 118/325, 324, 641–643; 156/209, 219, 156/231; 427/162, 512; 347/102, 104; 18/313–315, 663, 665, 684
See application file for complete search history.

(56) References Cited

U.S. PATENT DOCUMENTS

| | | | |
|---|---|---|---|
| 5,594,652 A * | 1/1997 | Penn ................... | B29C 67/0059 |
| | | | 345/419 |
| 2005/0174412 A1* | 8/2005 | Codos et al. .................. | 347/102 |
| 2011/0104391 A1* | 5/2011 | Miyamoto et al. ............ | 427/512 |

FOREIGN PATENT DOCUMENTS

| | | |
|---|---|---|
| JP | 2012-066497 A | 4/2012 |
| KR | 1020080001984 A | 1/2008 |

OTHER PUBLICATIONS

KIPO Office Action dated May 30, 2013; Appln. No. 10-2012-0084553.

* cited by examiner

*Primary Examiner* — Yewebdar Tadesse
(74) *Attorney, Agent, or Firm* — Ladas & Parry LLP

(57) ABSTRACT

A device for forming a roll-to-roll pattern includes: a plurality of rollers, that are separated from each other, for transferring a substrate in one direction; a pattern former provided on the substrate between neighboring rollers from among the plurality of rollers, and forming a pattern on the substrate; an absorber facing the pattern former with the substrate therebetween, and absorbing the substrate; a light irradiator neighboring the pattern former and irradiating light to the pattern; and a controller for controlling the roller, the pattern former, the absorber, and the light irradiator so that the pattern may be formed on the substrate and light may be irradiated to the pattern.

8 Claims, 7 Drawing Sheets

DEVICE AND METHOD FOR FORMING ROLL-TO-ROLL PATTERN

CROSS-REFERENCE TO RELATED APPLICATION

This application claims priority to and the benefit of Korean Patent Application No. 10-2012-0084553 filed in the Korean Intellectual Property Office on Aug. 1, 2012, the entire contents of which are incorporated herein by reference.

BACKGROUND OF THE INVENTION (a) Field of the Invention

The present invention relates to a roll-to-roll pattern forming device and a roll-to-roll pattern forming method. More particularly, the present invention relates to a roll-to-roll pattern forming device for forming a conductive pattern, and a roll-to-roll pattern forming method.

(b) Description of the Related Art

A pattern forming method is a method for forming a pattern with a desired shape on a predetermine part of a substrate.

Recently, a skill for forming a fluid- or paste-type conductive pattern on a predetermined portion of a flexible substrate like a film including at least one of paper, PET, and polyimide by using a printing scheme, thermally treating the conductive pattern to bake or sinter it, and thereby allowing it to be absorbed into the substrate has been used.

However, when the conductive pattern is formed on the flexible substrate, the flexible substrate has a curved surface so the conductive pattern is not formed at an accurate position.

Further, when the conductive pattern is thermally treated, the flexible substrate is physically or chemically transformed by heat and the entire processing time is increased, which causes inefficiency. Techniques for sintering the pattern by use of laser beams or microwaves have are currently being attempted, and when the laser beams are in use, it is difficult to process a wide-area pattern, and when the microwaves are used, the processing time is increased.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a roll-to-roll pattern forming device for forming a pattern at an accurate position of a flexible substrate, and a roll-to-roll pattern forming method.

The present invention has been made in another effort to provide a roll-to-roll pattern forming device for baking or sintering a pattern in a wide area at a high speed and preventing deformation of the substrate, and a roll-to-roll pattern forming method.

An exemplary embodiment of the present invention provides a device for forming a roll-to-roll pattern including: a plurality of rollers, that are separated from each other, for transferring a substrate in one direction; a pattern former provided on the substrate between neighboring rollers from among the plurality of rollers, and forming a pattern on the substrate; an absorber facing the pattern former with the substrate therebetween, and absorbing the substrate; a light irradiator neighboring the pattern former and irradiating light to the pattern; and a controller for controlling the roller, the pattern former, the absorber, and the light irradiator so that the pattern may be formed on the substrate and light may be irradiated to the pattern.

The substrate is flexible, the roller includes: a first sub-roll provided on the substrate, supporting a part of the substrate, and being rotated; and a second sub-roll facing the first sub-roll with the substrate therebetween, supporting another part of the substrate, and being rotated, and the controller controls a gap between the first sub-roll and the second sub-roll.

The controller drives the pattern former in a first direction that is parallel with a plate surface of the substrate, a second direction that is parallel with the plate surface of the substrate and crosses the first direction, and a third direction that crosses the second direction and is perpendicular to the plate surface of the substrate.

The absorber includes at least one first inlet for absorbing air.

The light irradiated by the light irradiator is white pulse light.

The device further includes a planarizer neighboring the absorber, facing the light irradiator with the substrate therebetween, and planarizing the substrate.

The planarizer includes at least one second inlet for absorbing air.

Pressure formed between the absorber and the substrate is greater than pressure formed between the planarizer and the substrate.

The pressure formed between the absorber and the substrate is 0.01 MPa to 0.08 MPa, and the pressure formed between the planarizer and the substrate is 0.005 MPa to 0.03 MPa.

Another embodiment of the present invention provides a method for forming a roll-to-roll pattern, including: providing the roll-to-roll pattern forming device; allowing a substrate to be supported on the plurality of separated rollers; allowing one area of the substrate to face the pattern former by rotating the rollers; forming a pattern in the one area of the substrate by using the pattern former; allowing the one area of the substrate to face the light irradiator by rotating the rollers; and using the light irradiator to irradiate light to the pattern and baking or sintering the pattern.

The substrate is flexible.

The light is white pulse light.

Pulse energy of the white pulse light is 0.1 to 100 J/cm$^2$.

An irradiation time of the white pulse light is 0.1 to 500 ms.

A pulse number of the white pulse light is 1 to 99.

The forming of a pattern is performed when the one area of the substrate is absorbed to the absorber.

Pressure between the absorber and the one area of the substrate is formed to be 0.01 MPa to 0.08 MPa.

The allowing of the one area of the substrate to face the light irradiator by rotating the rollers is performed when the absorption of the one area of the substrate absorbed to the absorber is canceled.

Yet another embodiment of the present invention provides a method for forming a roll-to-roll pattern, including: providing the roll-to-roll pattern forming device; allowing a substrate to be supported on the separated rollers; allowing the one area of the substrate to face the pattern former by rotating the rollers; allowing the one area of the substrate to be absorbed to the absorber, and using the pattern former to form a pattern in the one area of the substrate; allowing the one area of the substrate to face the light irradiator by rotating the rollers; and planarizing the one area of the substrate to the planarizer, using the light irradiator to irradiate light to the pattern, and baking or sintering the pattern.

Pressure between the planarizer and the one area of the substrate is 0.005 MPa to 0.03 MPa.

According to the embodiments of the present invention, the roll-to-roll pattern forming device for forming a pattern at an accurate position of the flexible substrate, and the roll-to-roll pattern forming method, are provided.

Further, the roll-to-roll pattern forming device for baking or sintering the pattern at a high speed and preventing deformation of the substrate, and the roll-to-roll pattern forming method, are provided.

DETAILED DESCRIPTION OF THE EMBODIMENTS

Figure 1:
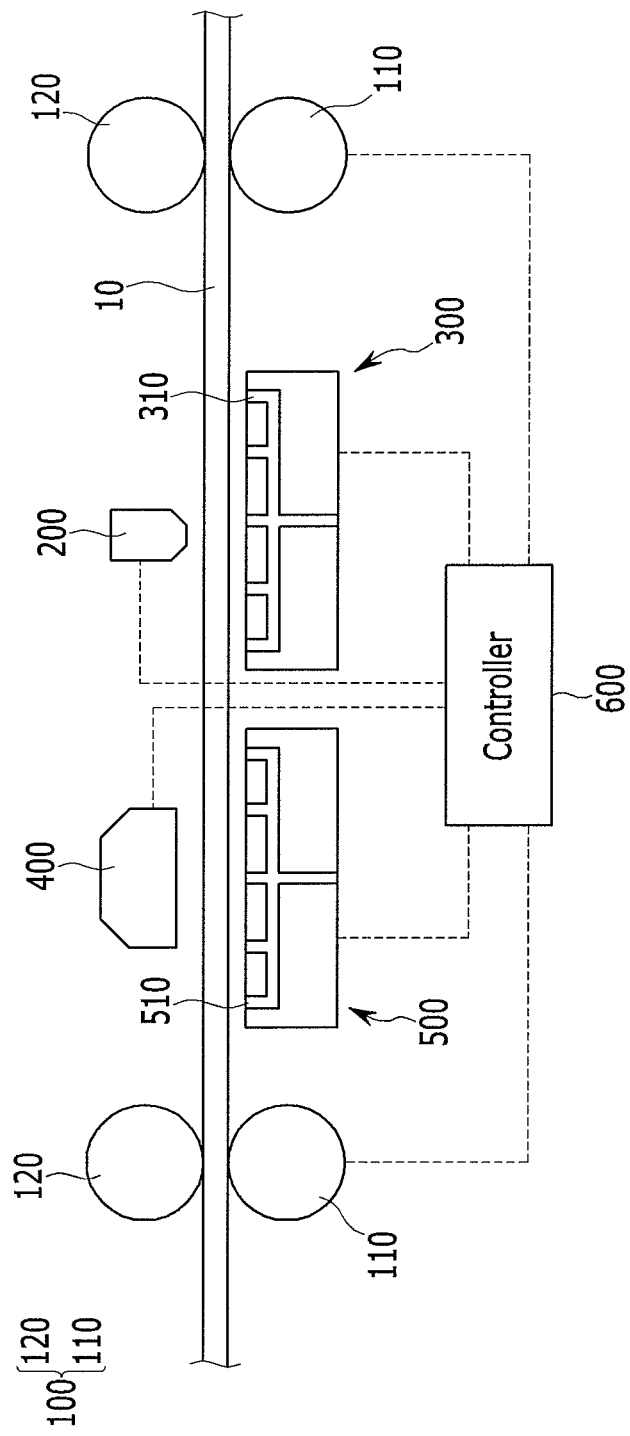
FIG. 1 shows a roll-to-roll pattern forming device according to a first exemplary embodiment of the present invention.

Hereinafter, the various exemplary embodiments of the present invention will be described in detail with reference to the accompanying drawings so that those skilled in the art can easily implement the exemplary embodiments of the present invention. The present invention may be implemented in various different types, and is not limited to the exemplary embodiment described herein.

In order to clarify the present invention, parts that are irrelevant to the description of the present invention are omitted, and the same reference numerals will be used throughout to designate the same or like elements.

In addition, the size and thickness of each component shown in the drawings are arbitrarily shown for understanding and ease of description, but the present invention is not limited thereto.

In the drawings, the thickness of layers, films, panels, regions, etc., are exaggerated for clarity. For better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Furthermore, throughout the specification, when an element is referred to as being "on" another element, it can be above another element or below another element. It does not mean that the element must be above another element in a gravity direction as a reference.

A roll-to-roll pattern forming device according to a first exemplary embodiment of the present invention will now be described with reference to FIG. 1.

FIG. 1 shows a roll-to-roll pattern forming device according to a first exemplary embodiment of the present invention.

As shown in FIG. 1, the roll-to-roll pattern forming device continuously forms a pattern on at least a part of a flexible substrate 10 like a film including one of paper, PET, and polyimide, and it includes a roller 100, a pattern former 200, an absorber 300, a light irradiator 400, a planarizer 500, and a controller 600.

The roller 100 transfers the substrate 10 in a first direction. A plurality of rollers 100 are provided and are separated from each other. The pattern former 200, the absorber 300, the light irradiator 400, and the planarizer 500 are provided between the neighboring rollers 100. The roller 100 includes a first sub-roll 110 and a second sub-roll 120.

The first sub-roll 110 is provided on the substrate 10 to support a part of the substrate 10, and it is self-rotated to transfer the substrate 10 in the first direction. The second sub-roll 120 faces the first sub-roll 110 with the substrate 10 therebetween, and supports another part of the substrate 10. The second sub-roll 120 is self-rotated to transfer the substrate 10 in the first direction.

The roller 100 is connected to the controller 600, and a gap between the first sub-roll 110 and the second sub-roll 120 is controllable by the controller 600.

The roller 100 of the roll-to-roll pattern forming device according to the first exemplary embodiment of the present invention includes the first sub-roll 110 and the second sub-roll 120, and the roll-to-roll pattern forming device according to another exemplary embodiment of the present invention can include a conveyor belt supported by the roller 100. In this case, the substrate 10 can be supported on the conveyor belt, and when the conveyor belt works according to rotation of the roller 100, the substrate 10 supported on the conveyor belt can be transferred. Also, regarding the roll-to-roll pattern forming device according to another exemplary embodiment of the present invention, at least one of the roller 100 and the conveyor belt can include a cooling means or a heating means, and the substrate 10 can be cooled or heated by using it.

The pattern former 200 is provided on the substrate 10 between the rollers 100 from among a plurality of rollers 100, and it forms a fluid- or paste-type pattern on the substrate 10. The pattern formed on the substrate 10 by the pattern former 200 has conductivity. The pattern formed by the pattern former 200 includes metal oxide nanoparticles or metal oxide precursors including lithium (Li), sodium (Na), potassium (K), rubidium (Rb), cesium (Cs), beryllium (Be), magnesium (Mg), calcium (Ca), strontium (Sr), barium (Ba), titanium (Ti), zirconium (Zr), hafnium (Hf), vanadium (V), niobium (Nb), tantalum (Ta), chrome (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), cadmium (Cd), mercury (Hg), boron (B), gallium (Ga), indium (In), thallium (Tl), silicon (Si), germanium (Ge), tin (Sn), lead (Pb), phosphorus (P), arsenic (As), antimony (Sb), bismuth (Bi), or a metal combination thereof, it includes conductive or insulating polymers that are dissolved in water or an organic solvent, or it includes carbon nanoparticles including carbon nanotubes (CNT) or graphene. The pattern former 200 can form the pattern on the substrate 10 by using various printing processes such as inkjet printing, and it can includes various elements that are known according to the above-noted coating method.

The pattern former 200 can move in a first direction that is parallel with a plate surface of the substrate 10, a second direction that is parallel with the plate surface of the substrate 10 and crosses the first direction, and a third direction that crosses the second direction and is perpendicular to the plate surface of the substrate 10, that is, the general x-, y-, and z-axis directions, and can form a pattern in one area of the substrate 10 in which the pattern will be formed. The pattern former 200 can be driven by a robot arm controlled by the controller 600.

The absorber 300 faces the pattern former 200 with the substrate 10 therebetween and absorbs the substrate 10. The absorber 300 includes at least one first inlet 310 for absorbing air, and the first inlet 310 can be provided over the entire plate surface of the substrate 10. The absorber 300 is connected to the controller 600, and its absorption on the substrate 10 is controlled by the controller 600. When the absorber 300 absorbs the substrate 10, the plate surface of the flexible substrate 10 becomes flat. A pressure between the absorber 300 and one area of the substrate 10 absorbed to the absorber 300 is formed to be 0.01 MPa to 0.08 MPa when the substrate 10 is a film made of polyimide with a thickness of 200 um. When the pressure is less than 0.01 MPa, the substrate 10 is not absorbed to the absorber 300, and when the pressure is greater than 0.08 MPa, the substrate 10 is deformed by the pressure so a uniform pattern cannot be formed on the substrate 10. That is, when the pressure is formed to be 0.01 MPa to 0.08 MPa, the one area of the substrate 10 on which the pattern is formed is absorbed to the absorber 300 in a flat manner without deformation caused by pressure.

The light irradiator 400 neighbors the pattern former 200 and irradiates light to the pattern formed on the substrate 10. The light irradiated by the light irradiator 400 is white pulse light which has pulse energy of 0.1 to 100 J/cm$^2$, has an irradiation period of 0.1 to 500 ms, and has a number of pulses of 1 to 99. The fluid- or paste-type pattern formed on the substrate 10 by the white pulse light irradiated to the pattern by the light irradiator 400 is baked or sintered and is thus stably fixed to the substrate 10. A light irradiation state by the light irradiator 400 is controllable by the controller 600. Also, the white pulse light irradiated by the light irradiator 400, differing from existing laser beams, has a large light irradiating area so the pattern formed on the wide substrate 10 can be baked or sintered simultaneously. Further, the light irradiator 400 includes a plurality of or a single Xenon flash lamp, a lamp housing having a cooling-water supply channel for cooling the lamp with water together with an additional cooling device, a triggering/control circuit, a capacitor, a reflector, and an optical wavelength filter. Here, the optical wavelength filter can be installed to selectively filter a predetermined wavelength range which is variable by a sort or a size of particles of the pattern formed on the substrate 10 and a sort or a size of the substrate 10. Further, the light irradiator 400 can further include a beam guide made of quartz for accurately controlling a light path or a distance controller for controlling a distance between the Xenon flash lamp and the substrate 10. By using the above-noted constituent elements, various conditions of the white pulse light irradiated by the light irradiator 400, for example, a pulse duration, a pulse off-time, a pulse number, a pulse peak intensity, and average pulse energy can be controlled.

The planarizer 500 neighbors the absorber 300 and faces the light irradiator 400 with the substrate 10 therebetween, and it absorbs the substrate 10 on which the pattern is formed to planarize the substrate 10. The planarizer 500 includes at least one second inlet 510 for absorbing air, and the second inlet 510 can be provided over the entire plate surface of the substrate 10. The planarizer 500 is connected to the controller 600, and an absorption state on the substrate 10 is controlled by the controller 600. When the planarizer 500 planarizes the substrate 10, the plate surface of the flexible substrate 10 becomes flat. The pressure between the planarizer 500 and the one area of the substrate 10 absorbed to the planarizer 500 is formed to be 0.005 MPa to 0.03 MPa when the substrate 10 is a film made of polyimide that is 200 um thick. When the pressure between the planarizer 500 and the one area of the substrate 10 is less than 0.005 MPa, the substrate 10 is not well absorbed to the planarizer 500 so the substrate 10 is not planarized, and when the pressure is greater than 0.03 MPa, the substrate 10 is strongly absorbed to the planarizer 500 so the substrate 10 cannot be continuously transferred in the case of light sintering or baking by the light irradiator 400, and a time for continuously sintering or baking the pattern on the substrate 10 is increased.

That is, the pressure between the planarizer 500 and the one area of the substrate 10 is less than the pressure between the absorber 300 and the one area of the substrate 10, and when it is formed to be 0.005 MPa to 0.03 MPa, the one area of the substrate 10 on which the pattern is baked or sintered is formed to be planarized in a flat manner on the planarizer 500, and the pattern formed on the substrate 10 is transferred to the substrate 10 and is continuously baked or sintered.

The roll-to-roll pattern forming device according to the first exemplary embodiment of the present invention includes the planarizer 500, and the roll-to-roll pattern forming device according to another exemplary embodiment of the present invention may not include the planarizer 500.

The controller 600 is connected to the roller 100, the pattern former 200, the absorber 300, the light irradiator 400, and the planarizer 500, and it controls the roller 100, the pattern former 200, the absorber 300, the light irradiator 400, and the planarizer 500 so that the pattern may be formed on the substrate 10 and light may be irradiated to the pattern. The controller 600 is connected to a roller driving means for controlling rotation of the roller 100 and a gap between the first sub-roll 110 and the second sub-roll 120, a pattern former driving means for driving movement of the x, y, and z axes of the pattern former 200, a first pumping means for pumping air through a first inlet 310 of the absorber 300, a light irradiating means for irradiating light of the light irradiator 400, and a second pumping means for pumping air through a second inlet 510 of the planarizer 500.

In detail, the controller 600 controls the roller 100 to transfer the substrate 10 in a first direction, it uses the absorber 300 to absorb the substrate 10 and controls the pattern former 200 to form a pattern on the substrate 10, it uses the planarizer 500 to absorb the substrate 10, and it controls the light irradiator 400 to bake or sinter the pattern formed on the substrate 10.

Accordingly, the roll-to-roll pattern forming device according to the first exemplary embodiment of the present invention uses the light irradiated by the light irradiator 400 to bake or sinter the pattern formed on the substrate 10, so it uses the light that is white pulse light having a wider light irradiating area than the existing laser beams to bake or sinter the fluid- or paste-type pattern formed by the pattern former 200 according to a predetermined degree and thereby bake or sinter a plurality of patterns that are formed on the large substrate 10 by performing a single light irradiation process.

That is, when the pattern is baked or sintered by the light, the roll-to-roll pattern forming device according to the first exemplary embodiment of the present invention irradiates the white pulse light to the pattern to the degree in which the pattern will be baked or sintered, thereby stably baking or sintering the pattern formed on the substrate 10 to a desired level and preventing the heat conduction caused by the light irradiated by the light irradiator 400 to the flexible substrate 10. Hence, the physical or chemical deformation of the substrate 10 by the heat generated by the light, a heat treatment means for baking or sintering the pattern, is prevented.

Also, when forming a pattern on the flexible substrate 10, the roll-to-roll pattern forming device according to the first exemplary embodiment of the present invention uses the absorber 300 to absorb the flexible substrate 10, form the plate surface of the substrate 10 to be flat with a curved surface generated according to the characteristic of flexibility, and form a pattern on the substrate 10, thereby forming the pattern at the accurate position of the substrate 10. That is, the roll-to-roll pattern forming device having improved reliability when forming the pattern is provided.

Further, when baking or sintering the pattern formed on the flexible substrate 10, the roll-to-roll pattern forming device according to the first exemplary embodiment of the present invention uses the planarizer 500 to planarize the flexible substrate 10 to form the plate surface of the substrate 10 to be flat, and bakes or sinters the pattern formed on the substrate 10 while transferring the substrate 10, thereby uniformly applying heat to the plate surface of the substrate 10. That is, compared to the case in which the substrate 10 has a curved surface that is generated according to the flexible characteristic, heat is continuously and uniformly applied to the flat plate surface of the substrate 10, so the roll-to-roll pattern forming device improving reliability on entire pattern formation and increasing a pattern forming rate is provided. In addition, this also functions as a factor for preventing deformation of the curved surface of the substrate 10 caused by applying heat.

A roll-to-roll pattern forming method according to a second exemplary embodiment of the present invention will now be described with reference to FIG. 2 to FIG. 7. The roll-to-roll pattern forming method according to the second exemplary embodiment of the present invention can be performed by using the roll-to-roll pattern forming device according to the first exemplary embodiment of the present invention.

Figure 2:
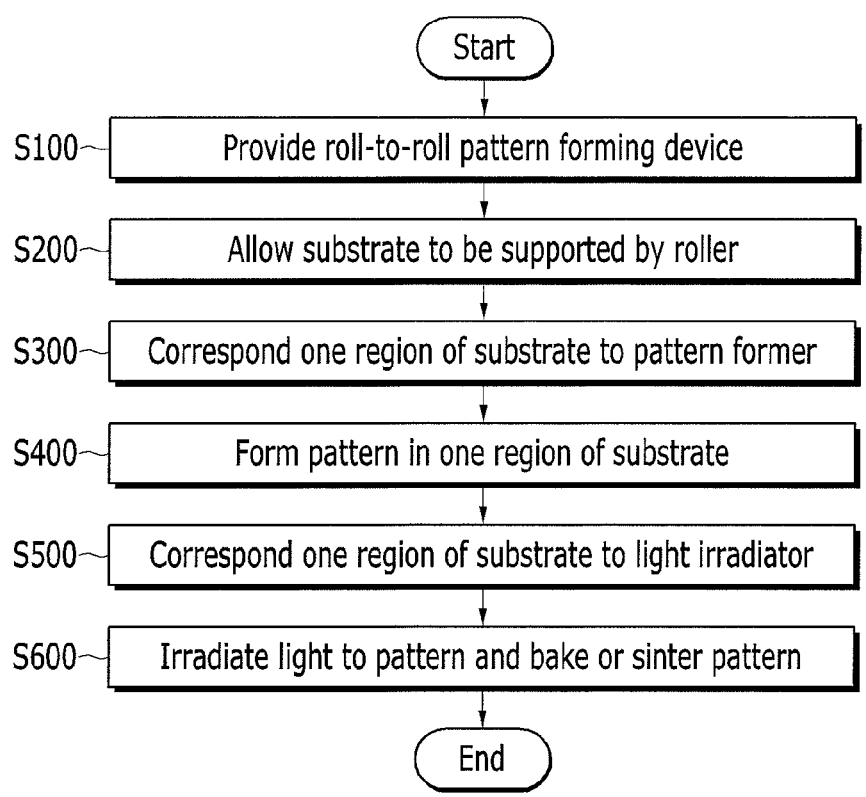
FIG. 2 shows a flowchart of a roll-to-roll pattern forming method according to a second exemplary embodiment of the present invention.

FIG. 2 shows a flowchart of a roll-to-roll pattern forming method according to the second exemplary embodiment of the present invention. FIG. 3 to FIG. 7 show a roll-to-roll pattern forming method according to a second exemplary embodiment of the present invention.

Figure 3:
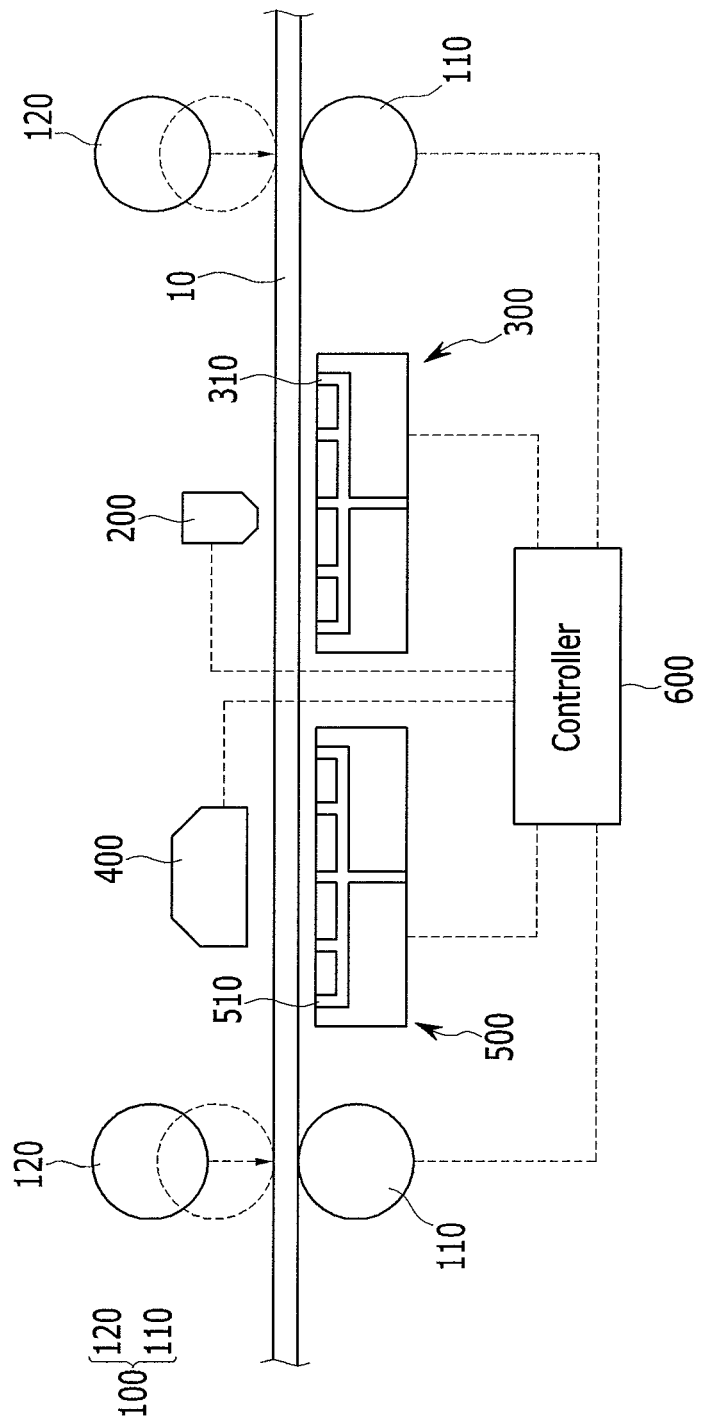
FIG. 3 to FIG. 7 show a roll-to-roll pattern forming method according to a second exemplary embodiment of the present invention.

As shown in FIG. 2 and FIG. 3, a roll-to-roll pattern forming device is provided (S100).

In detail, the roll-to-roll pattern forming device according to the first exemplary embodiment of the present invention is provided.

A substrate 10 is supported on a roller 100 (S200).

In detail, the flexible substrate 10 like a film including at least one of paper, PET, and polyimide is supported on a plurality of rollers 100 that are separated from each other, the first sub-roll 110 is separated from the second sub-roll 120, the substrate 10 is inserted between the first sub-roll 110 and the second sub-roll 120, and a gap between the first sub-roll 110 and the second sub-roll 120 is controlled to allow a part of the substrate 10 to be supported on the first sub-roll 110 and another part of the substrate 10 to be supported on the second sub-roll 120. The gap between the first sub-roll 110 and the second sub-roll 120 is controlled by the controller 600.

Figure 4:
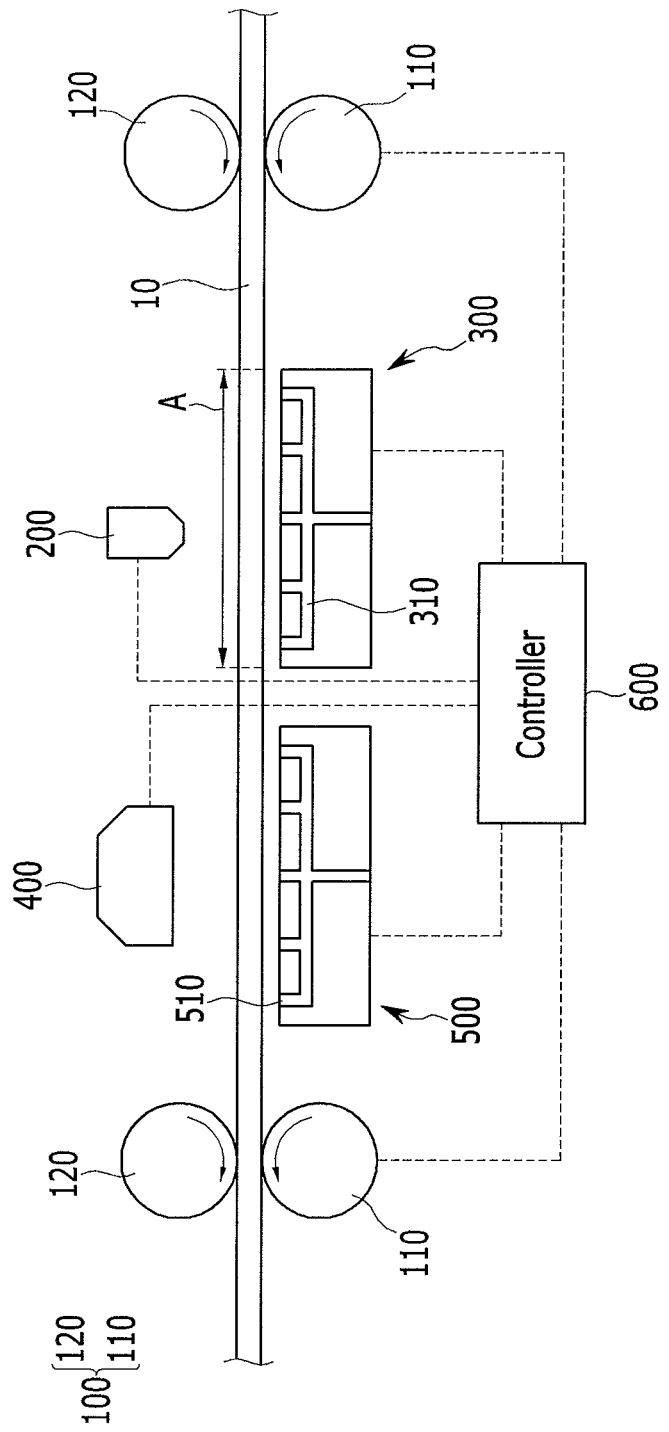

As shown in FIG. 4, one area (A) of the substrate 10 is provided to face the pattern former 200 (S300).

In detail, a plurality of rollers 100 are rotated to allow the one area (A) of the substrate 10 to face the pattern former 200, and the first sub-roll 110 and the second sub-roll 120 are respectively rotated so that the one area (A) of the substrate 10 provided between the first sub-roll 110 and the second sub-roll 120 faces the pattern former 200. The rotation of the first sub-roll 110 and the second sub-roll 120 is controlled by the controller 600.

Figure 5:
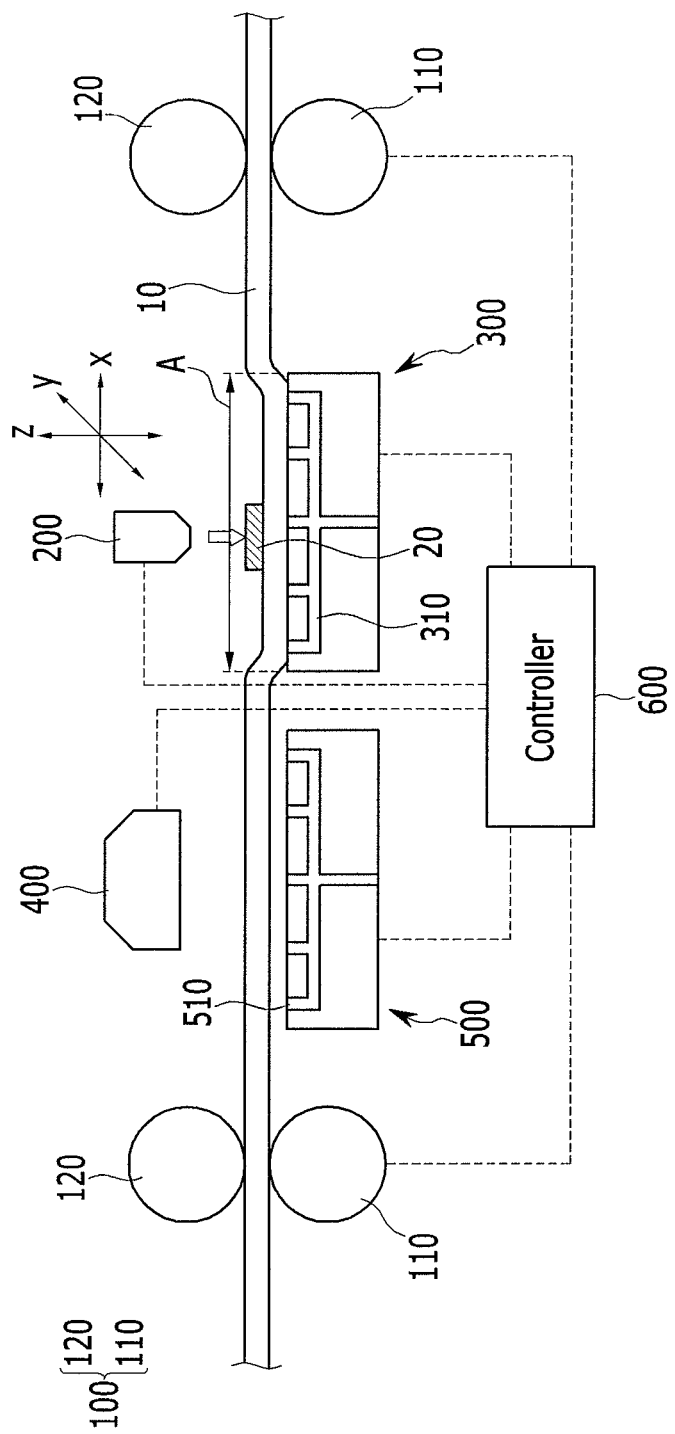

As shown in FIG. 5, a pattern 20 is formed in one area (A) of the substrate 10 (S400).

In detail, the pattern former 200 is used to form the pattern 20 in the one area (A) of the substrate 10, the one area (A) of the substrate 10 is absorbed to the absorber 300 corresponding to the pattern former 200 to form a flat plate surface of the one area (A) of the substrate 10, and the pattern former 200 is used to form the pattern 20 in the one area (A) of the substrate 10. Here, the pressure between the absorber 300 and the one area (A) of the substrate 10 absorbed to the absorber 300 is formed to be 0.01 MPa to 0.08 MPa when the substrate 10 is a film made of polyimide that is 200 um thick. When the pressure between the absorber 300 and the one area (A) of the substrate 10 is less than 0.01 MPa, the substrate 10 is not absorbed to the absorber 300, and when the pressure is greater than 0.08 MPa, the substrate 10 is deformed by pressure and the uniform pattern is not formed on the substrate 10. That is, the pressure between the absorber 300 and the one area (A) of the substrate 10 is formed to a value between 0.01 MPa and 0.08 MPa so the one area (A) of the substrate 10 on which the pattern 20 is formed is not deformed by the pressure and is absorbed to the absorber 300 in a flat manner. In this instance, the pattern former 200 can move in a first direction that is parallel with a plate surface of the substrate 10, a second direction that is parallel with the plate surface of the substrate 10 and crosses the first direction, and a third direction that crosses the second direction and is perpendicular to the plate surface of the substrate 10, that is, the general x-, y-, and z-axis directions, and can form a pattern in one area of the substrate 10 in which the pattern will be formed. Absorption of the absorber 300 and movement of the pattern former 200 are controlled by the controller 600. The pattern 20 formed by the pattern former 200 is made of a fluid or a paste. The pattern 20 has conductivity, and it includes lithium (Li), sodium (Na), potassium (K), rubidium (Rb), cesium (Cs), beryllium (Be), magnesium (Mg), calcium (Ca), strontium (Sr), barium (Ba), titanium (Ti), zirconium (Zr), hafnium (Hf), vanadium (V), niobium (Nb), tantalum (Ta), chrome (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), cadmium (Cd), mercury (Hg), boron (B), gallium (Ga), indium (In), thallium (Tl), silicon (Si), germanium (Ge), tin (Sn), lead (Pb), phosphorus (P), arsenic (As), antimony (Sb), bismuth (Bi), or a metal combination thereof, it includes conductive or insulating polymers that are dissolved in water or organic solvent, or it includes carbon nanoparticles including carbon nanotubes (CNT) or graphene.

Figure 6:
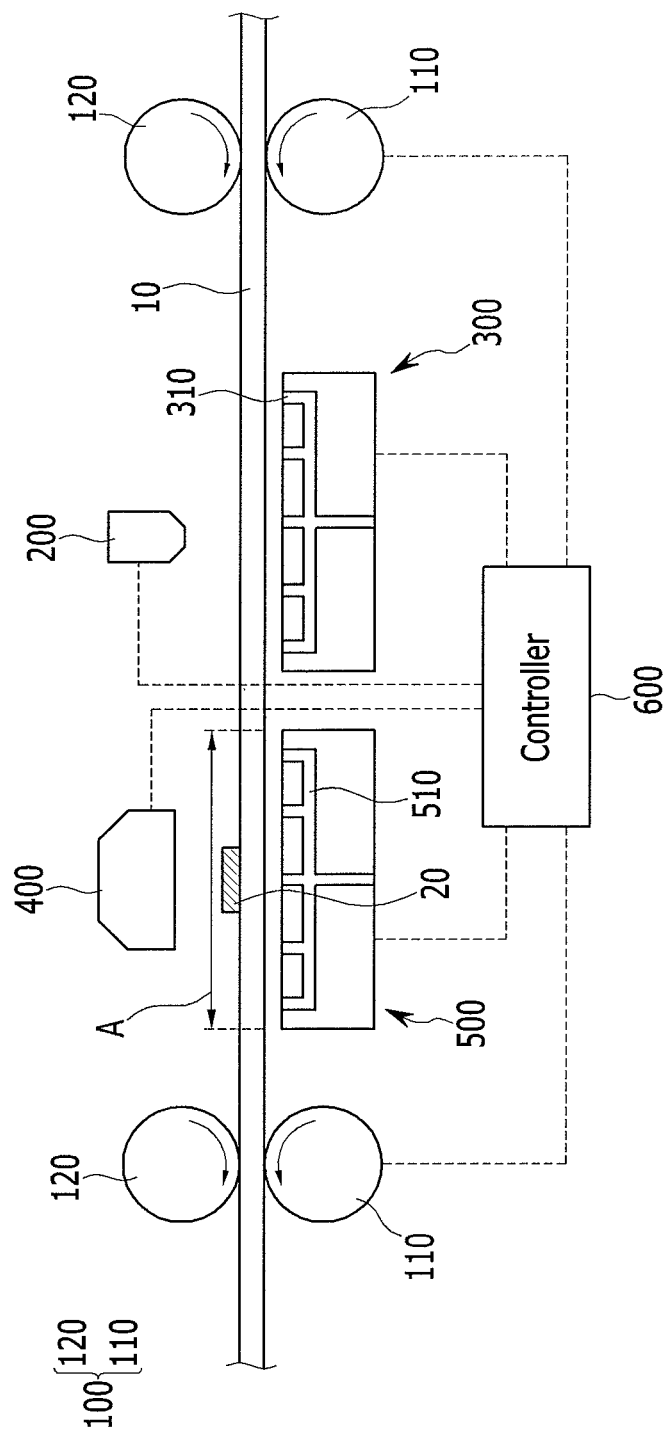

As shown in FIG. 6, a one area (A) of the substrate 10 is provided to face the light irradiator 400 (S500).

In detail, a plurality of rollers 100 are rotated to allow the one area (A) of the substrate 10 to face the light irradiator 400, the one area (A) of the substrate 10 absorbed to the absorber 300 is released from its absorption to separate the one area (A) of the substrate 10 from the absorber 300, and the rollers 100 are rotated to allow the one area (A) of the substrate 10 to face the light irradiator 400. The release from absorption of the absorber 300 and the rotation of the rollers 100 are controlled by the controller 600.

Figure 7:
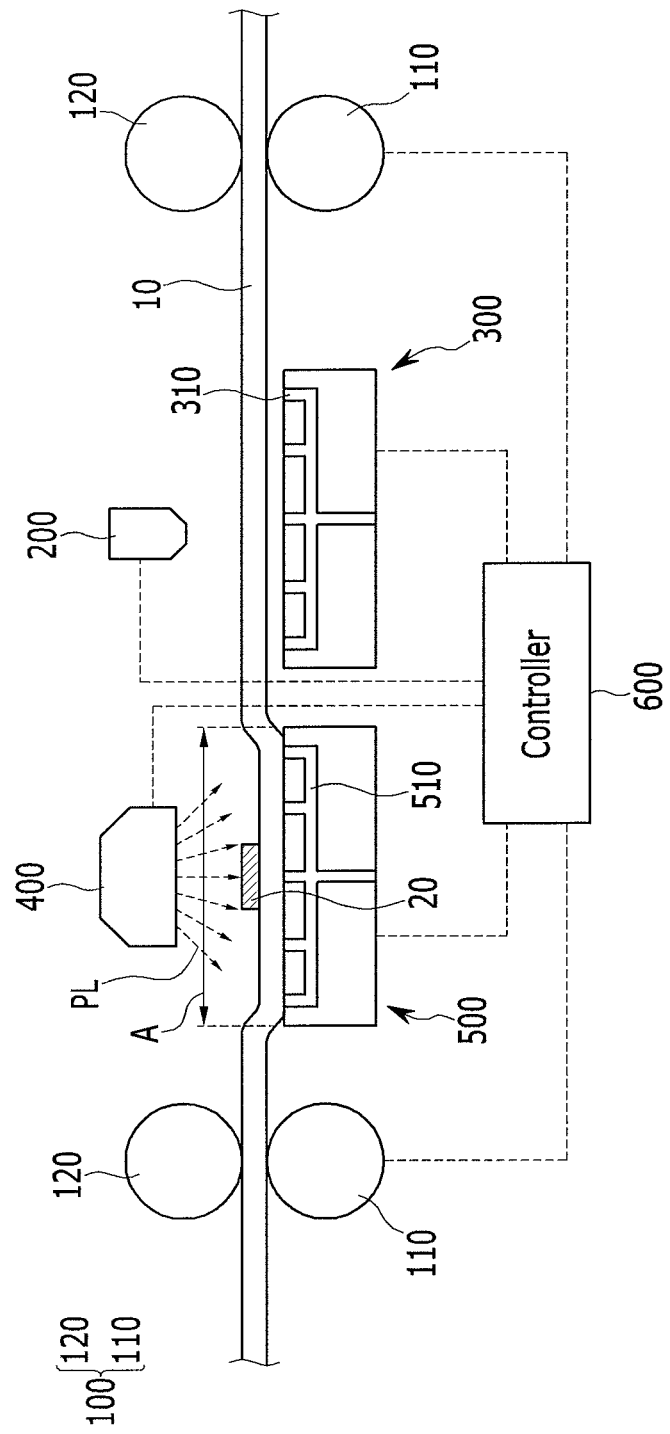

As shown in FIG. 7, light (PL) is irradiated to the pattern 20 to bake or sinter the pattern 20 (S600).

In detail, the light irradiator 400 is used to bake or sinter the pattern 20 formed in one area (A) of the substrate 10, the plate surface of the one area (A) of the substrate 10 is formed to be flat to the planarizer 500 facing the light irradiator 400, and the light (PL) irradiated by the light irradiator 400 is used to bake and sinter the pattern 20 formed in the one area (A) of the substrate 10. In this instance, the pressure between the planarizer 500 and the one area (A) of the substrate 10 absorbed to the planarizer 500 is formed to be 0.005M Pa to 0.03M Pa when the substrate 10 is a film made of polyimide that is 200 um thick. When the pressure between the planarizer 500 and the one area of the substrate 10 is less than 0.005 MPa, the substrate 10 is not well absorbed to the planarizer 500 so the substrate 10 is not planarized, and when the pressure therebetween is greater than 0.03 MPa, the substrate 10 is strongly absorbed to the planarizer 500 and the substrate 10 cannot be continuously transferred in the case of light sintering or baking by the light irradiator 400 so the time for continuously sintering or baking the pattern on the substrate 10 is increased. That is, the pressure between the planarizer 500 and the one area (A) of the substrate 10 is formed to be 0.005 MPa to 0.03 MPa so the one area (A) of the substrate 10 on which the pattern 20 is baked or sintered is made flat to the planarizer 500 and the pattern 20 formed on the substrate 10 is transferred to the substrate 10 and is continuously baked or sintered. The light (PL) irradiated by the light irradiator 400 is white pulse light which has pulse energy of 0.1 to 100 J/cm$^2$, has an irradiation period of, 0.1 to 500 ms and has a number of pulses of 1 to 99, and the fluid- or paste-type pattern 20 formed on the substrate 10 by the white pulse light is baked or sintered. Absorption of the planarizer 500 and optical irradiation of the light irradiator 400 are controlled by the controller 600.

Accordingly, the roll-to-roll pattern forming method according to the second exemplary embodiment of the present invention uses the roller 100, the pattern former 200, and the light irradiator 400 to continuously form the baked or sintered pattern 20 on the substrate 10.

That is, when the pattern 20 is baked or sintered by light, the roll-to-roll pattern forming method according to the second exemplary embodiment of the present invention irradiates white pulse light having a wider light irradiation area than the existing laser beams to the pattern 20 until the pattern 20 is baked or sintered, so the patterns 20 that are formed on the wide substrate 10 are stably baked or sintered up to the desired level, and heat conduction by the light irradiated by the light irradiator 400 to the flexible substrate 10 is prevented. Hence, the physical or chemical deformation of the substrate 10 by the heat generated by the light, a heat treatment means for baking or sintering the pattern 20, is prevented.

Further, when the pattern 20 is formed on the flexible substrate 10, the roll-to-roll pattern forming method according to the second exemplary embodiment of the present invention uses the absorber 300 to absorb the one area (A) of the flexible substrate 10 and form a flat plate surface of the one area (A) of the substrate 10 without a curved surface generated according to the flexible characteristic, and forms the pattern 20 in the one area (A) of the substrate 10, thereby forming the pattern 20 at the accurate position of the substrate 10. That is, the roll-to-roll pattern forming method having improved reliability on forming the pattern is provided. This works as a factor for improving pattern formation reliability in the continuous pattern forming process.

In addition, when the pattern 20 formed on the flexible substrate 10 is baked or sintered, the roll-to-roll pattern forming method according to the second exemplary embodiment of the present invention uses the planarizer 500 to planarize the one area (A) of the flexible substrate 10 on which the pattern 20 is formed and form the plate surface of the substrate 10 to be flat, and transfers the substrate 10 and bakes or sinters the pattern 20 formed on the one area (A) of the substrate 10 thereby uniformly applying heat to the plate surface of the one area (A) of the substrate 10. That is, compared to the case in which the substrate 10 has a curved surface according to the flexible characteristic, heat is uniformly applied to the flat plate surface of the one area (A) of the substrate 10 to which the light (PL) is irradiated so the roll-to-roll pattern forming device improving reliability on pattern formation and the pattern formation rate is provided. Also, this functions as a factor for preventing the curved surface of the substrate 10 caused by applying of heat by the light (PL).

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A device for forming a roll-to-roll pattern comprising:
a plurality of rollers, that are separated from each other, for transferring a substrate in a conveying direction;
a pattern former disposed between neighboring rollers from among the plurality of rollers for forming a pattern on the substrate;
an absorber facing the pattern former for absorbing the substrate with the substrate between the absorber and the pattern former to flatten the substrate so as to enable the pattern former to form the pattern on the substrate when the substrate is flattened;
a light irradiator spaced from the pattern former for irradiating light to the pattern;
a planarizer facing the light irradiator for flattening the substrate with the substrate between the light irradiator and the planarizer so as to enable the light irradiator to irradiate the pattern on the substrate when the substrate is flattened; and
a controller for controlling the roller, the pattern former, the absorber, the light irradiator and the planarizer so that the pattern may be formed on the substrate and light may be irradiated to the pattern, wherein the pattern former and absorber are disposed in a first region of the device and the light irradiator and planarizer are spaced therefrom in a second region of the device downstream of the first region and the plurality of rollers are configured to transfer the substrate in the conveying direction from the first region to the second region so that the substrate can pass sequentially between the pattern former and absorber to form the pattern on the substrate and then between the light irradiator and planarizer to irradiate the pattern.

2. The device of claim 1, wherein
the substrate is flexible, and
the roller includes:
a first sub-roll provided on the substrate, supporting a part of the substrate, and being rotated; and
a second sub-roll facing the first sub-roll with the substrate therebetween, supporting another part of the substrate, and being rotated, and
the controller controls a gap between the first sub-roll and the second sub-roll.

3. The device of claim 1, wherein
the controller drives the pattern former in a first direction that is parallel with a plate surface of the substrate, a second direction that is parallel with the plate surface of the substrate and crosses the first direction, and a third direction that crosses the second direction and is perpendicular to the plate surface of the substrate.

4. The device of claim 1, wherein
the absorber includes at least one first inlet for absorbing air.

5. The device of claim 1, wherein
the light irradiated by the light irradiator is white pulse light.

6. The device of claim 4, wherein
the planarizer includes at least one second inlet for absorbing air.

7. The device of claim 6, wherein
pressure formed between the absorber and the substrate is greater than pressure formed between the planarizer and the substrate.

8. The device of claim 7, wherein
the pressure formed between the absorber and the substrate is 0.01 MPa to 0.08 MPa, and the pressure formed between the planarizer and the substrate is 0.005 MPa to 0.03 MPa.

* * * * *